(12) United States Patent
Chin et al.

(10) Patent No.: US 8,044,405 B2
(45) Date of Patent: Oct. 25, 2011

(54) THIN FILM TRANSISTOR SUBSTRATE AND MANUFACTURING METHOD THEREOF

(75) Inventors: Hong-Kee Chin, Suwon-si (KR); Sang-Gab Kim, Seoul (KR); Woong-Kwon Kim, Cheonan-si (KR); Yong-Mo Choi, Osan-si (KR); Seung-Ha Choi, Siheung-si (KR); Shin-Il Choi, Seoul (KR); Ho-Jun Lee, Anyang-si (KR); Jung-Suk Bang, Guri-si (KR); Yu-Gwang Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 12/429,388

(22) Filed: Apr. 24, 2009

(65) Prior Publication Data

US 2010/0148182 A1  Jun. 17, 2010

(30) Foreign Application Priority Data

Dec. 17, 2008 (KR) .................. 10-2008-0128494

(51) Int. Cl.
*H01L 29/12* (2006.01)
*H01L 21/336* (2006.01)
(52) U.S. Cl. ............ 257/72; 257/E29.151; 349/43
(58) Field of Classification Search .......... 257/59, 257/72, E29.273, E21.411, E29.151, E21.414; 349/43, 138, 150
See application file for complete search history.

(56) References Cited

U.S. PATENT DOCUMENTS

2008/0042133 A1* 2/2008 Chin et al. .............. 257/59

FOREIGN PATENT DOCUMENTS

| JP | 2005-222732 | 8/2005 |
|---|---|---|
| KR | 10-1997-0030393 | 6/1997 |
| KR | 10-1999-0015670 | 3/1999 |
| KR | 10-1999-0048962 | 7/1999 |
| KR | 10-2001-0008892 | 2/2001 |
| KR | 10-2001-0011858 | 2/2001 |
| KR | 10-2001-0053873 | 7/2001 |
| KR | 10-2003-0042282 | 5/2003 |
| KR | 10-2006-0069173 | 6/2006 |
| KR | 10-2006-0072409 | 6/2006 |
| KR | 10-2006-0134470 | 12/2006 |

* cited by examiner

*Primary Examiner* — Thomas L Dickey
*Assistant Examiner* — Fazli Erdem
(74) *Attorney, Agent, or Firm* — Cantor Colburn LLP

(57) ABSTRACT

A thin film transistor (TFT) substrate is provided in which a sufficiently large contact area between conductive materials is provided in a contact portion and a method of fabricating the TFT substrate. The TFT substrate includes a gate interconnection line formed on an insulating substrate, a gate insulating layer covering the gate interconnection line, a semiconductor layer arranged on the gate insulating layer, a data interconnection line including a data line, a source electrode and a drain electrode formed on the semiconductor layer, a first passivation layer formed on the data interconnection line and exposing the drain electrode, a second passivation layer formed on the first passivation film and a pixel electrode electrically connected to the drain electrode. An outer sidewall of the second passivation layer is positioned inside an outer sidewall of the first passivation layer.

5 Claims, 24 Drawing Sheets

THIN FILM TRANSISTOR SUBSTRATE AND MANUFACTURING METHOD THEREOF

This application claims priority to Korean Patent Application No. 10-2008-0128494, filed on Dec. 17, 2008, and all the benefits accruing therefrom under 35 U.S.C. §119, the contents of which in its entirety are herein incorporated by reference.

BACKGROUND OF THE INVENTION

1. Field of the Invention

The present invention relates to a thin film transistor ("TFT") array substrate and a method of fabricating the same, and more particularly, to a TFT array substrate in which a driving margin may be increased and a sufficiently large contact area between conductive materials may be provided in a contact portion, and a method of fabricating the TFT array substrate.

2. Description of the Related Art

A liquid crystal display (LCD) includes two opposing display panels and a liquid crystal layer interposed therebetween. Each display panel may use a transparent insulating substrate as a supporting substrate. A plurality of thin film patterns may be formed on the insulating substrate. A thin film pattern formation includes a material deposition and a mask process. However, a photolithography process may include multiple steps, such as photoresist coating, mask arrangement, exposure, baking, development, and cleaning, thus increasing the entire processing time and the manufacturing cost.

In order to reduce the number of mask processes, a lift-off method has been studied. More specifically, when a passivation film and a pixel electrode are formed on a TFT array substrate, the passivation film is patterned using a photoresist pattern, a conductive material is deposited on the entire surface of the TFT array substrate, and the photoresist pattern and the conductive material thereon are simultaneously removed using a photoresist stripper. The conductive material remaining on the substrate forms a pixel electrode.

The photoresist stripper may contact the sides or bottom of the photoresist pattern to remove the photoresist pattern covered with the conductive material. To prevent a pattern defect due to a residual portion of the photoresist pattern remaining on the substrate, the contact area of the photoresist pattern with the photoresist stripper should be sufficiently large. Specifically, the passivation film under the photoresist pattern should form a sufficiently large undercut under the inner side of the photoresist pattern. However, if the passivation film is over-etched to form such an undercut, an insulating film on a storage electrode may be over-etched and its thickness may become non-uniform, thus causing a reduction in a driving margin. Moreover, a data interconnection line may be damaged by over-etching, and etching of the data interconnection line in a contact area may cause contact failure.

SUMMARY OF THE INVENTION

This invention provides a TFT array substrate that increases a driving margin and provides a sufficiently large contact area between conductive materials in a contact portion.

The present invention also provides a TFT array substrate that enables easy lift-off and prevents over-etching of a gate insulating layer and damage to a data interconnection line.

The present invention discloses a thin film transistor (TFT) substrate including a gate interconnection line comprising a gate line and a gate electrode arranged on an insulating substrate, a gate insulating layer formed on the gate interconnection line, a semiconductor layer formed on the gate insulating layer, a data interconnection line comprising a data line, a source electrode, and a drain electrode formed on the semiconductor layer, a first passivation layer formed on the data interconnection line and exposing a portion of the drain electrode, a second passivation layer formed on the first passivation film, wherein the outer sidewalls of the second passivation film are positioned inside the outer sidewalls of the first passivation film and a pixel electrode connected to the drain electrode.

The present invention also discloses a method of fabricating a thin film transistor (TFT) substrate. The method includes forming a gate interconnection line on an insulating substrate, the gate interconnection line comprising a gate line and a gate electrode, forming a gate insulating layer on the gate interconnection line, forming a semiconductor layer and a data interconnection line on the semiconductor layer, the data interconnection line comprising a data line, a source electrode, and a drain electrode, sequentially forming a first passivation layer and a second passivation layer on the data interconnection line, the second passivation layer has more porous lattice structure than that of the first passivation layer, etching the second passivation layer and the first passivation layer, and exposing a drain electrode of a drain electrode-pixel electrode contact portion and forming a pixel electrode connected to the drain electrode, wherein etching the second passivation layer and the first passivation layer comprises forming the outer sidewalls of the second passivation layer inside the outer sidewalls of the first passivation layer.

It is to be understood that both the foregoing general description and the following detailed description are exemplary and explanatory and are intended to provide further explanation of the invention as claimed.

DETAILED DESCRIPTION OF THE PREFERRED EMBODIMENT

Figure 1:
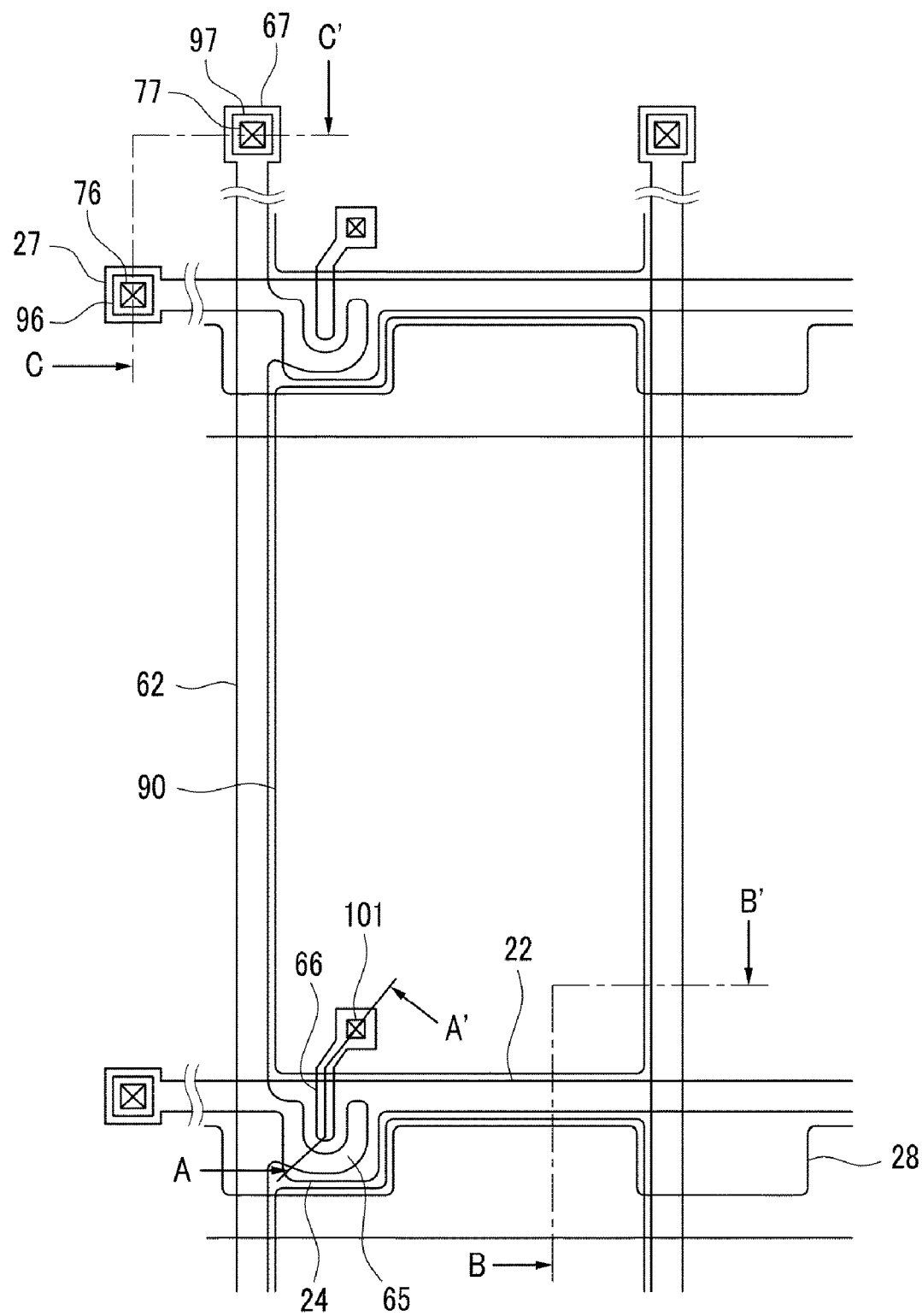
FIG. 1 is a layout of a TFT substrate according to an exemplary embodiment of the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated or reduced for clarity.

In the following description, it will be understood that when an element or a layer is referred to as being "on" or "connected to" another element or layer, it can be directly on or directly connected to the other element or layer, or intervening layers or elements may also be present. In contrast, when an element is referred to as being "directly on" or "directly connected to" another element, there are no intervening elements present. Like reference numerals refer to like elements throughout the specification. The terms "and/or" comprises each and at least one combination of referenced items.

Spatially relative terms, such as "beneath", "below", "lower", "above", "upper" and the like, may be used herein for ease of description to describe one element or feature's relationship to another element(s) or feature(s) as illustrated in the Figures. It will be understood that the spatially relative terms are intended to encompass different orientations of the device in use or operation in addition to the orientation depicted in the Figures.

Hereinafter a TFT substrate according to the exemplary embodiments of the present invention will be described in detail with reference to the accompanying drawings.

Figure 2A:
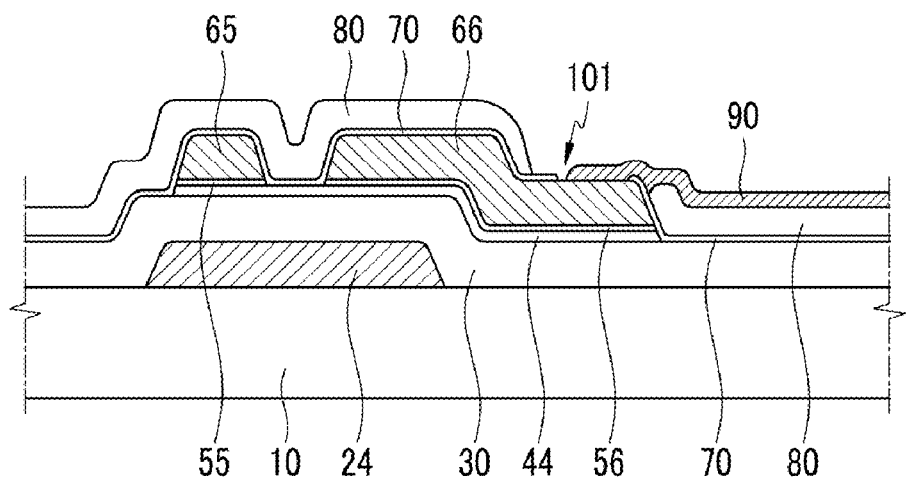
FIG. 2A is a cross-sectional view taken along line A-A' of FIG. 1.
Figure 2B:
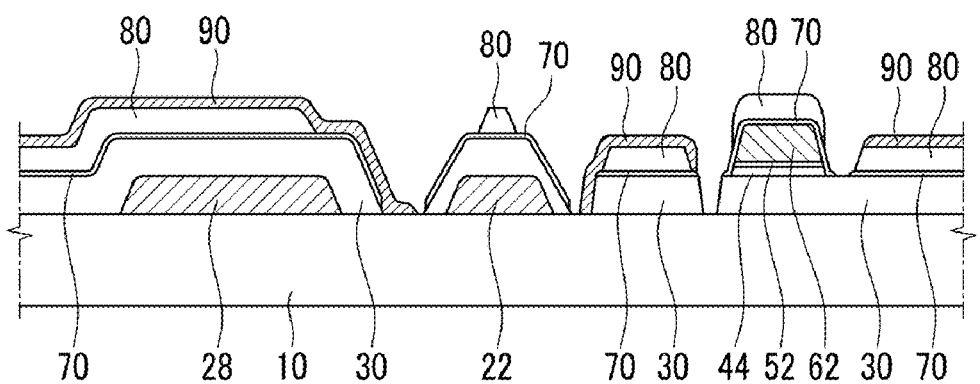
FIG. 2B is a cross-sectional view taken along line B-B' of FIG. 1.
Figure 2C:
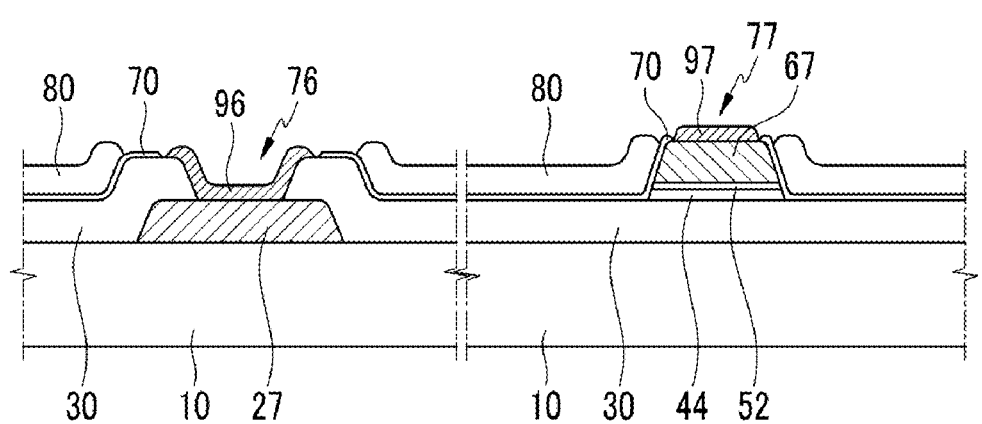
FIG. 2C is a cross-sectional view taken along line C-C' of FIG. 1.

FIG. 1 is a layout of a TFT substrate according to an exemplary embodiment of the invention, and FIG. 2A, FIG. 2B, and FIG. 2C are cross-sectional views taken along lines A-A', B-B', and C-C', respectively, of FIG. 1.

A TFT substrate according to an exemplary embodiment of the invention includes a TFT formed on an insulating substrate, a first passivation layer covering the TFT, and a second passivation layer formed on the first passivation layer. The TFT is a three-terminal device including a control terminal, an input terminal, and an output terminal and may include a gate electrode, a source electrode, a drain electrode, and a semiconductor layer. In the TFT, unless otherwise described, the gate electrode may be the control terminal, the source electrode may be the input terminal, and the drain electrode may be the output terminal. The semiconductor layer may form a channel region of the TFT.

Referring to FIG. 1, FIG. 2A, FIG. 2B and FIG. 2C, an insulating substrate 10 supports a TFT and may be formed of, for example, transparent glass or plastic. A gate line 22, a gate pad 27 and a gate electrode 24 are formed on the insulating substrate 10.

The gate line 22 for transmitting gate signal is disposed on the insulating substrate 10. The gate lines 22 are spaced apart from each other and extend parallel with each other in a first direction, such as a row direction shown in FIG. 1. A gate pad 27 having an expanded width is connected to an end of each gate line 22. In modified embodiments of the invention, although not shown, the gate pad 27 may be formed at two opposite terminals of the gate line 22, or may be omitted.

The gate electrode 24 is connected to the gate line 22. Each gate electrode 24 may extend from the gate line 22.

The gate electrode 24, the gate line 22, and the gate pad 27 may be formed directly on the insulating substrate 10. Throughout this specification, the gate electrode 24, the gate line 22, and the gate pad 27 are referred to as a gate interconnection line for the convenience of explanation.

The storage electrode 28, which may be formed of the same material as the gate interconnection line, may be formed directly on the insulating substrate 10. The storage electrode 28 is formed between the gate lines 22 and extends in the first direction parallel to the gate line 22. A storage electrode pad (not shown), which may be similar to the gate pad 27, may be made at one terminal of the storage electrode 28. The shape of the storage electrode 28 may vary and the invention is not limited to the shape shown in FIG. 1.

The gate interconnection line and the storage electrode 28 may be formed as a single layer such as aluminum (Al), copper (Cu), silver (Ag), molybdenum (Mo), chrome (Cr), titanium (Ti), tantalum (Ta), or alloys thereof, or as a multi-layered structure including combinations of these materials, but the invention is not limited thereto.

The gate insulation layer 30 may be formed of silicon nitride (SiNx) and may be formed on the gate interconnection line and the storage electrode 28. However, the gate insulation layer 30 may not be formed on the gate interconnection line in a gate contact portion 76 where the gate pad 27 contacts an auxiliary gate pad 96.

A semiconductor layer 44 and ohmic contact layers 52, 55 and 56, which may be formed of silicide or n+ hydrogenated amorphous silicon doped with n-type impurities, are formed on the gate insulating layer 30. The semiconductor layer 44 has substantially the same pattern as data interconnection lines, which will be described in further detail below, except for the channel region. A channel region of a thin film transistor corresponds to where the semiconductor layer 44 overlaps with the gate electrode 24.

The data line 62, the data pad 67, the source electrode 65, and the drain electrode 66 are formed on the semiconductor layer 44 and on the ohmic contact layers 52, 55 and 56.

The data lines 62 are spaced apart from each other and extend parallel with each other in a second direction, such as a column direction shown in FIG. 1. The data lines 62 cross with the gate lines 22. A data pad 67 having an expanded width is connected to an end of each data line 62. In modified embodiments of the invention, although not shown, the data pad 67 may be formed at two opposite terminals of the data line 62, or may be omitted.

The source electrode 65 is connected to the data line 62. Each source electrode 62 is opposite to and faces a drain electrode 66. The semiconductor layer 44 may be exposed between the source electrode 65 and the drain electrode 66. Throughout this specification, the data line 62, the data pad 67, the source electrode 62, and the drain electrode 66 are referred to as a data interconnection line for the convenience of explanation.

The data interconnection line may be formed as a single layer of Al, Cu, Ag, Mo, Cr, Ti, Ta, or alloys thereof, or as a multi-layered structure including combinations of these materials, but the invention is not limited thereto.

A first passivation layer 70 is arranged on the data interconnection line except in an area where the drain electrode 66 contacts the pixel electrode 90, referred to as a drain electrode-pixel electrode contact portion 101, and except in an area where the data pad 67 contacts an auxiliary data pad 97, referred to as a data contact portion 77. The first passivation layer 70 is also formed on the channel region of the thin film transistor. In addition the first passivation layer 70 is formed on the gate interconnection line except for the gate contact portion 76. Specifically, in an area where the gate interconnection line does not overlap with the data interconnection line, the first passivation layer 70 is formed on the gate insulating layer 30 in a region corresponding to the gate interconnection line. In an area where the gate interconnection line overlaps with the data interconnection line, the first passivation layer 70 is formed on the corresponding data interconnection line. In the space between the source electrode 65 and the drain electrode 66, which overlaps with the gate electrode 24, the first passivation layer 70 is formed on the semiconductor layer 44.

The first passivation layer 70 may be formed of silicon nitride (SiNx) which is the same material as the gate insulating layer 30. The first passivation layer 70 is characterized that it has a dense lattice structure. The first passivation layer 70 may have a thickness in a range of about 50 Å to about 500 Å, or in a range of about 100 Å to about 300 Å.

A second passivation layer 80 is formed on the first passivation layer 70. The second passivation layer 80 may overlap with the first passivation layer 70. The outer sidewall of the second passivation layer 80 is positioned inside the outer sidewall of the first passivation layer 70. In other words, the sidewall of the first passivation layer 70 extends beyond the sidewall of the second passivation layer 80.

The second passivation layer 80 may be formed of silicon nitride (SiNx) which is the same material as the first passivation layer 70. However the second passivation layer 80 has a porous lattice structure compared to the lattice structure of the first passivation layer 70. The second passivation layer 80 may have a thickness in a range of about 1,000 Å to about 3,000 Å, or in a range of about 1,500 Å to about 2,500 Å.

The first passivation layer 70 and the second passivation layer 80 may protect lower structures such as the data interconnection line, the semiconductor layer 44, and the gate interconnection line.

In a formation area of the gate pad 27, the gate contact portion 76 is formed through the gate insulating layer 30, the first passivation layer 70 and the second passivation layer 80. In a formation area of the data pad 67, the data contact portion 77 is formed through the first passivation layer 70 and the second passivation layer 80.

The pixel electrode 90 may be made of a transparent conductive material such as indium tin oxide (ITO) or indium zinc oxide (IZO) in the pixel area. The pixel electrode 90 extends to the drain electrode-pixel electrode contact portion 101 and is connected to the drain electrode 66 at the drain electrode-pixel electrode contact portion 101.

The auxiliary gate pad 96 connects to the gate pad 27 in the formation area of the gate pad 27, and the auxiliary data pad 97 connects to the data pad 67 in the formation area of the data pad 67. The auxiliary gate pad 96 and the auxiliary data pad 97 may be formed of the same material, which may be the same material as the pixel electrode 90.

Hereinafter, a method of fabricating a TFT substrate will be described in detail.

FIGS. 3A to 11C are cross-sectional views showing processing steps of the method of fabricating the TFT substrate shown in FIG. 2A to FIG. 2C.

Figure 3A:
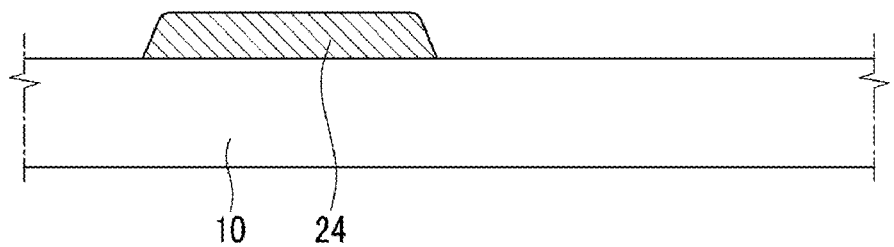
FIGS. 3A, 4A, 5A, 6A, 7A, 8A, 9A, 10A, 11A and 12A are cross-sectional views showing processing steps of the method of fabricating the TFT substrate shown in FIG. 2A according to an exemplary embodiment of the invention.
Figure 3B:
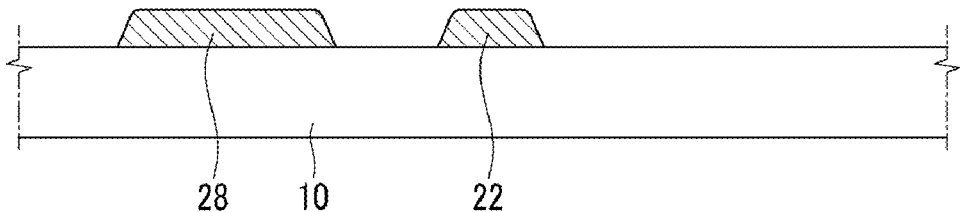
FIGS. 3B, 4B, 5B, 6B, 7B, 8B, 9B, 10B, 11B and 12B are cross-sectional views showing processing steps of the method of fabricating the TFT substrate shown in FIG. 2B according to an exemplary embodiment of the invention.
Figure 3C:
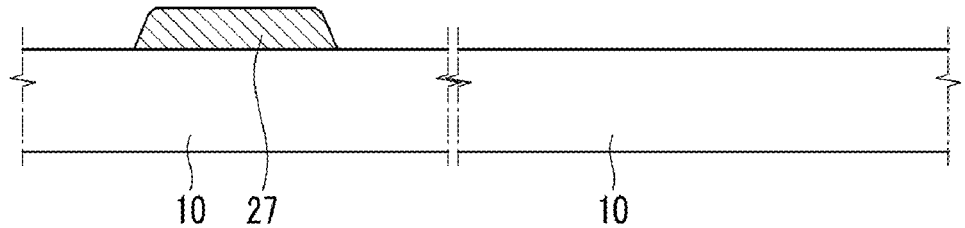
FIGS. 3C, 4C, 5C, 6C, 7C, 8C, 9C, 10C, 11C and 12C are cross-sectional views showing processing steps of the method of fabricating the TFT substrate in FIG. 2C according to an exemplary embodiment of the invention.

Referring first to FIG. 3A, FIG. 3B, and FIG. 3C, the gate interconnection line and the storage electrode 28 are formed on the insulating substrate 10. More specifically, a gate conductive layer is deposited on the insulating substrate 10 using, for example, sputtering, and is then photo-etched to form the gate line 22, the gate pad 27, the gate electrode 24 and the storage electrode 28.

Figure 4A:
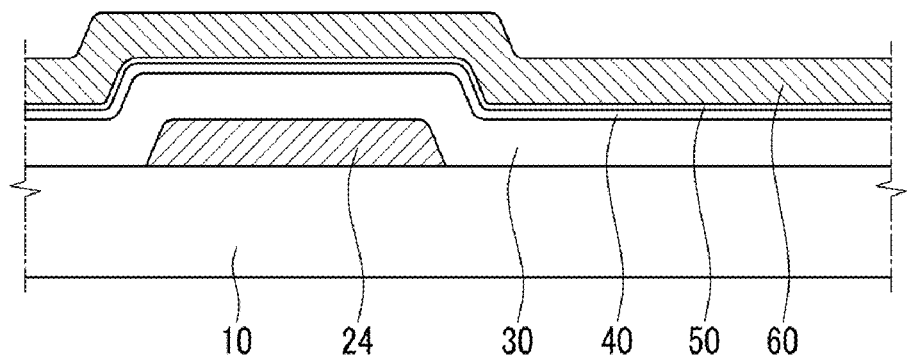
Figure 4B:
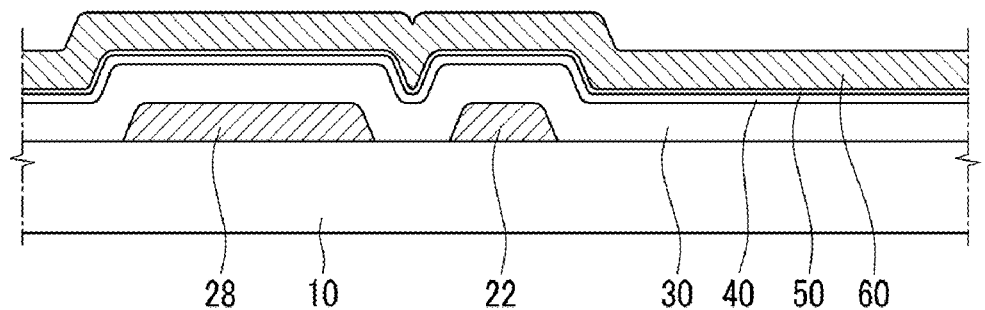
Figure 4C:
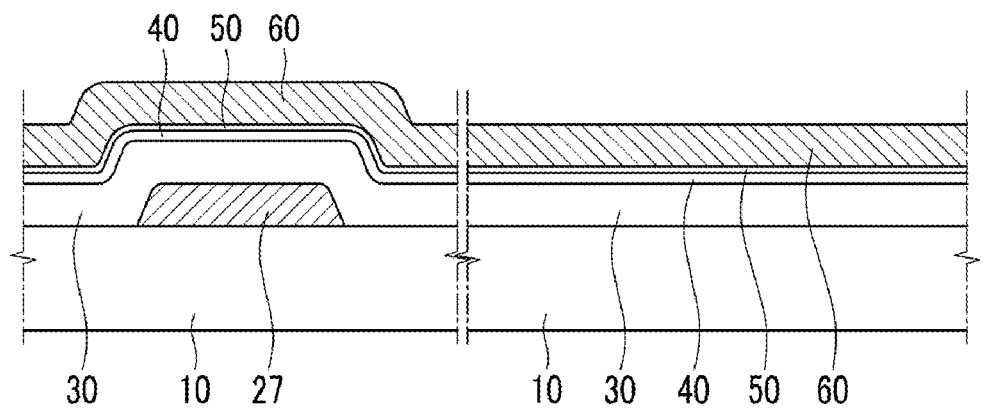

Referring to FIG. 4A, FIG. 4B, and FIG. 4C, a gate insulating layer 30, a first amorphous silicon layer 40, which may be made of hydrogenated amorphous silicon, and a second amorphous silicon layer 50, which may be made of silicide or n+ hydrogenated amorphous silicon doped with high concentration n-type impurities, are deposited on the gate interconnection line and the storage electrode 28. The gate insulating layer 30, the first amorphous silicon layer 40, and the second amorphous silicon layer 50 may be deposited using, for example, chemical vapor deposition (CVD).

Next, a data conductive layer 60 is deposited on the second amorphous silicon layer 50 using, for example, sputtering.

Figure 5A:
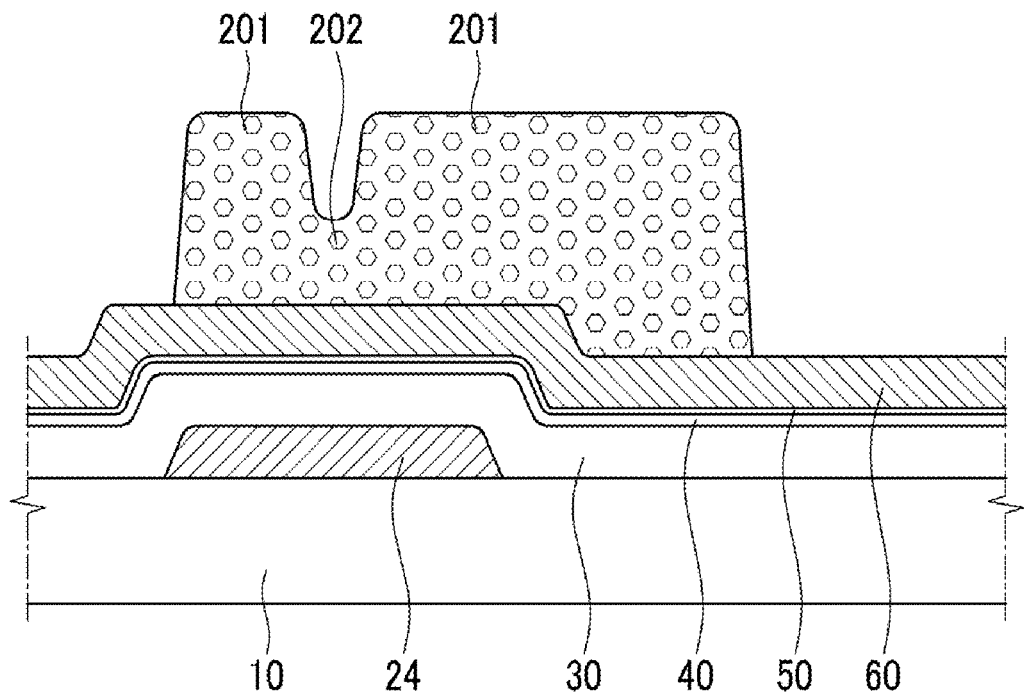
Figure 5B:
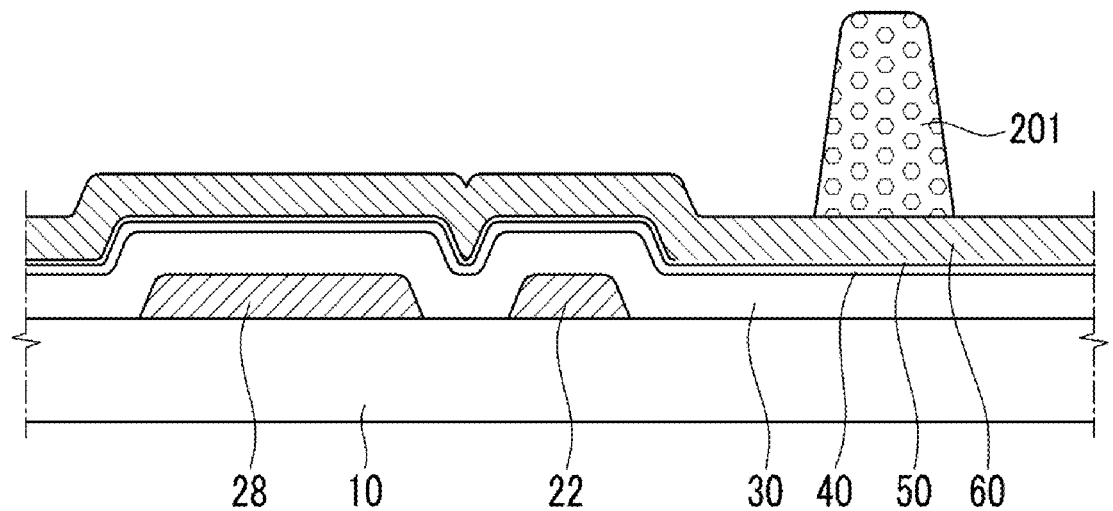
Figure 5C:
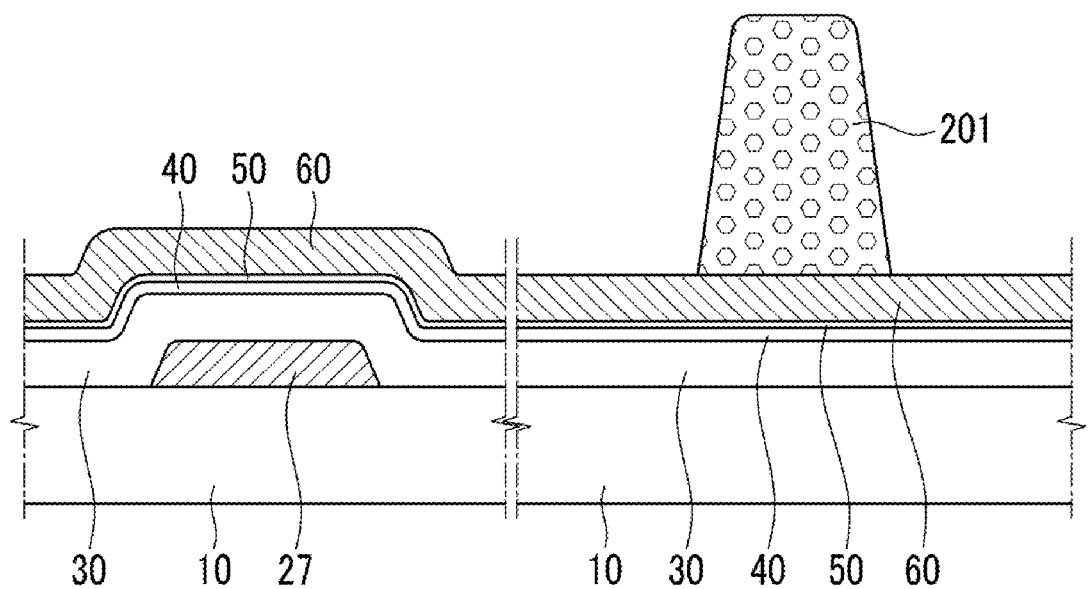

Referring to FIG. 5A, FIG. 5B, and FIG. 5C, a photoresist pattern 201 and 202 is formed on the data conductive layer 60. The photoresist pattern includes a first region 201 and a second region 202 having a smaller thickness than the first region 201. The first region 201 covers a formation area of a data line 62, a data pad 67, a source electrode 65, and a drain electrode 66 shown in FIG. 2A, FIG. 2B, and FIG. 2C. The second region 202 covers a space between the source electrode 65 and the drain electrode 66. Here, the size of the photoresist pattern 201 and 202 for each region is selected considering that it may be reduced in its size during subsequent etching and ashing processes. The photoresist pattern 201 and 202 may be formed using a slit mask or a half-tone mask, which can also be applied to other photoresist patterns to be described below.

Figure 6A:
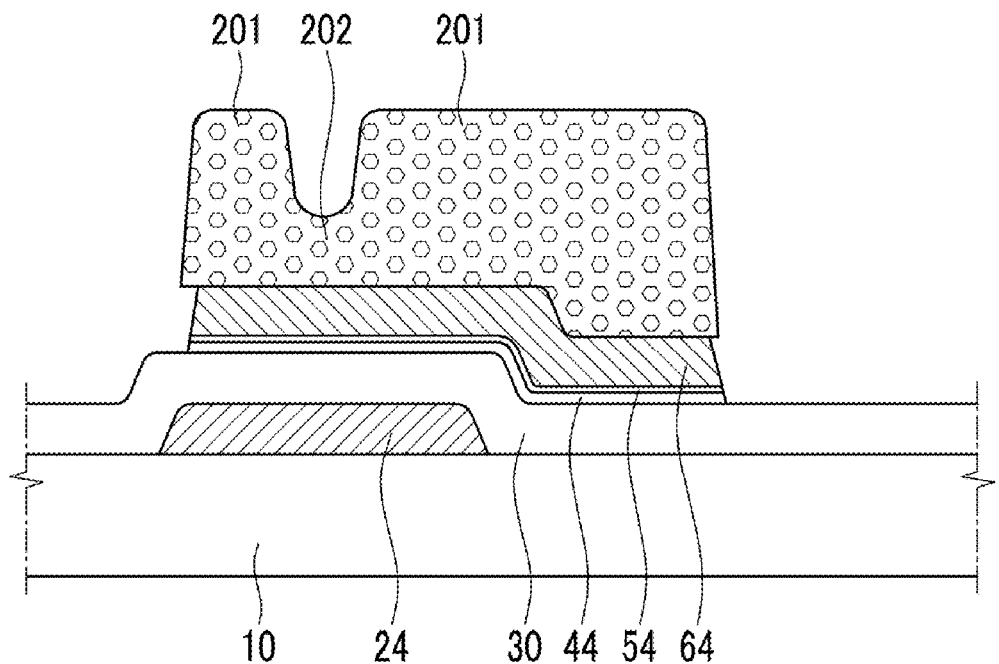
Figure 6B:
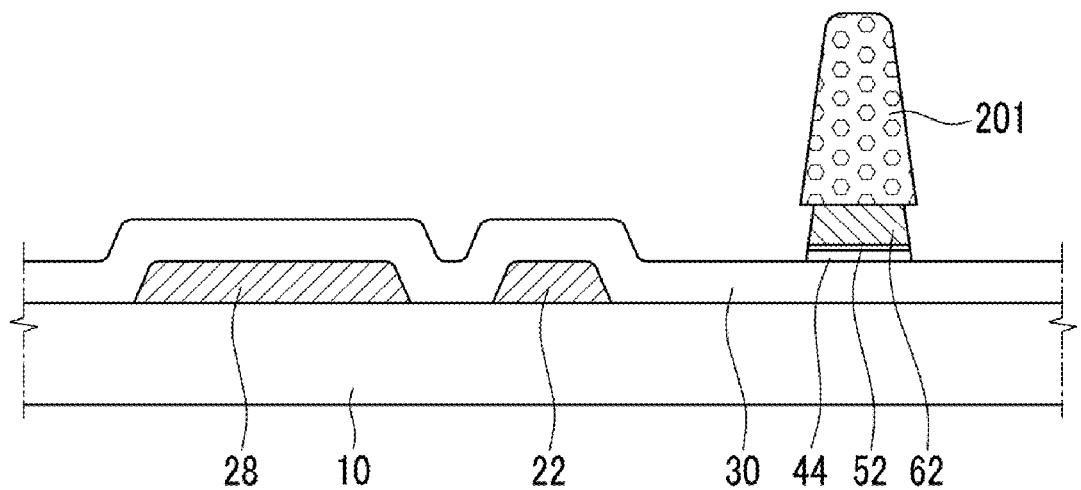
Figure 6C:
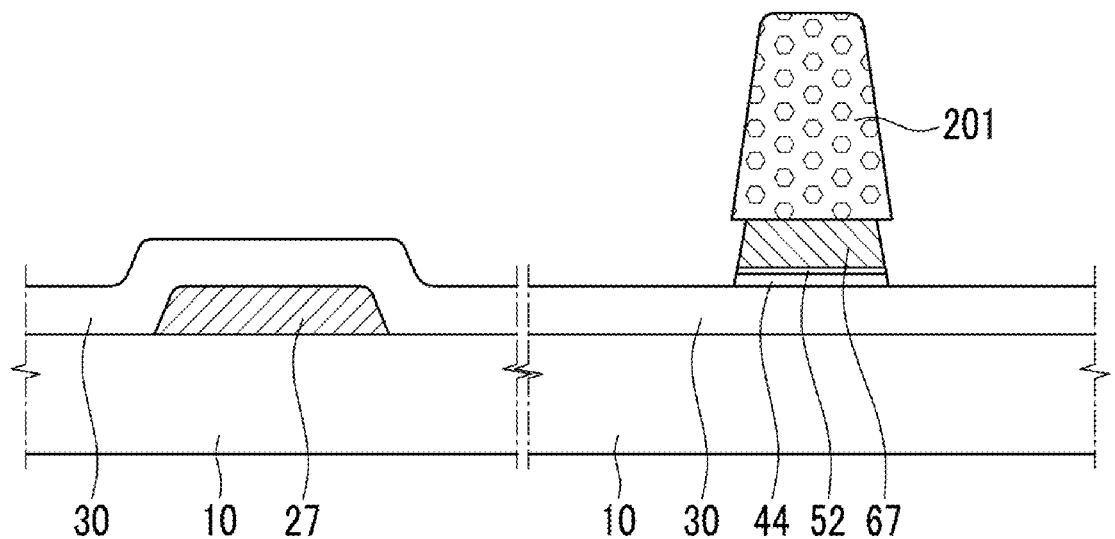

Referring to FIG. 6A, FIG. 6B, and FIG. 6C, the exposed data conductive layer 60 is etched using the photoresist pattern 201 and 202 as an etching mask. The data conductive layer 60 may be etched using one of various methods depending on the required type and thickness of the data conductive layer 60, but may be etched using wet etching. As a result, patterns of the data line 62 and the data pad 67 are formed. However, patterns of the source electrode 65 and the drain electrode 66 are not yet formed and the data conductive layer 64 remains integrated in the channel region.

Once the data conductive layer 60 is etched, the second amorphous silicon layer 50 is exposed and the exposed second amorphous silicon layer 50 and the first amorphous silicon layer 40 are etched. The second amorphous silicon layer 50 and the first amorphous silicon layer 40 may be etched using, for example, dry etching. As a result a semiconductor layer 44 is formed. In a region where the first amorphous silicon layer 40 is etched, the gate insulating layer 30 may be exposed. In this step the photoresist pattern is used as an etching mask and is partially etched and thus is reduced in size. Patterns 52 and 54 of the etched second amorphous silicon layer and the completed semiconductor layer 44 are substantially the same as those of the data line 62, the data pad 67, and the data conductive layer 64 that is not separated in the channel region.

Figure 7A:
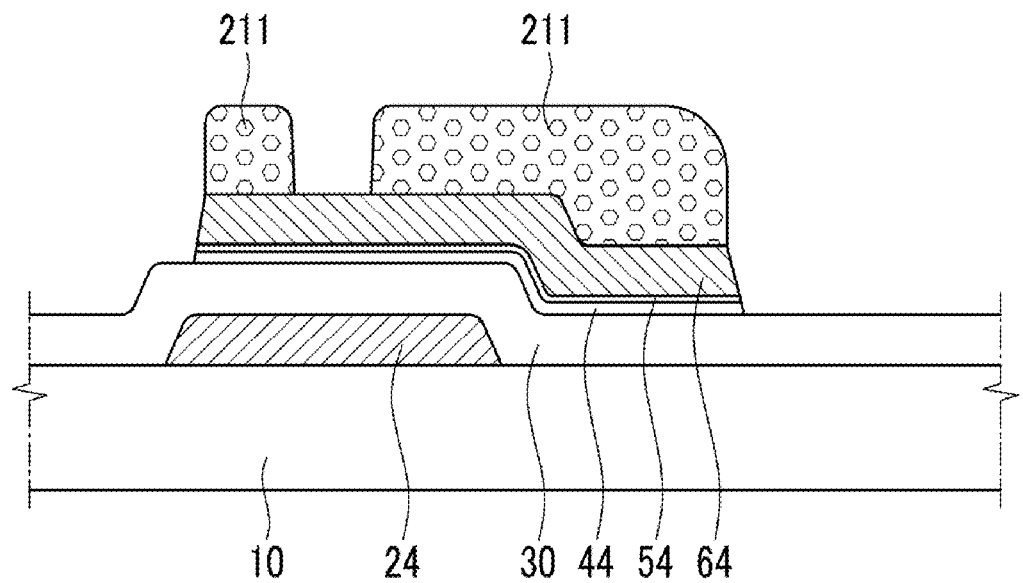
Figure 7B:
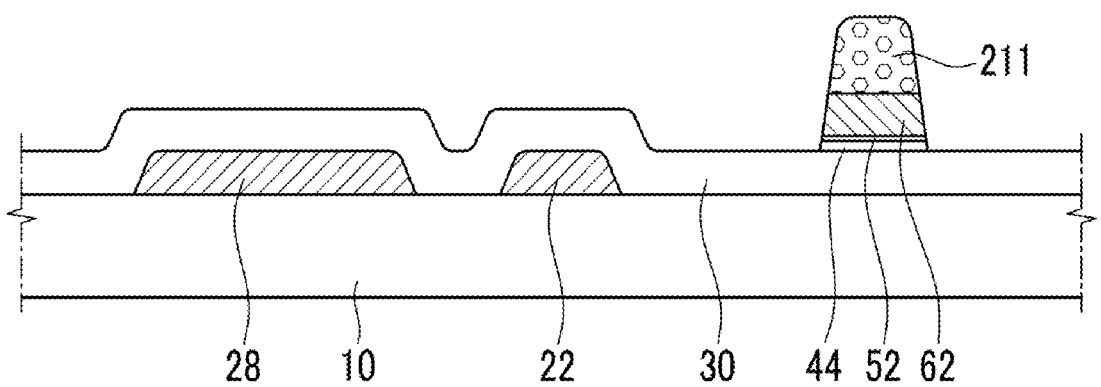
Figure 7C:
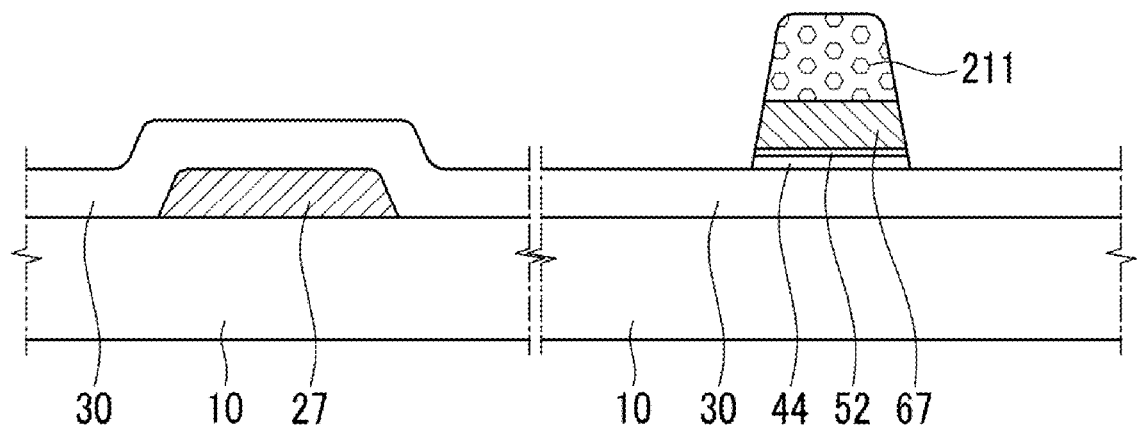

Referring to FIG. 7A, FIG. 7B, and FIG. 7C, the data conductive layer 64 is exposed by removing the second region 202 of the photoresist pattern by an ashing process using oxygen (O2). The ashing process may be skipped once the second region 202 is already removed in the above-described dry etching step.

Figure 8A:
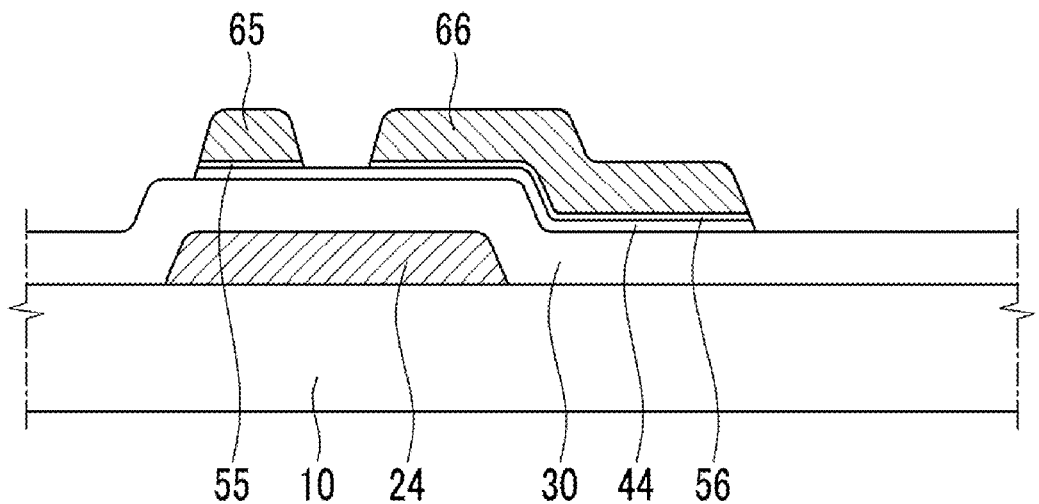
Figure 8B:
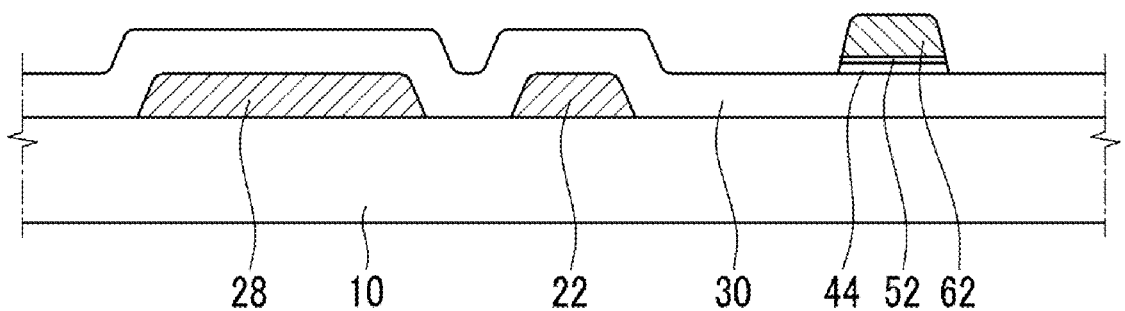
Figure 8C:
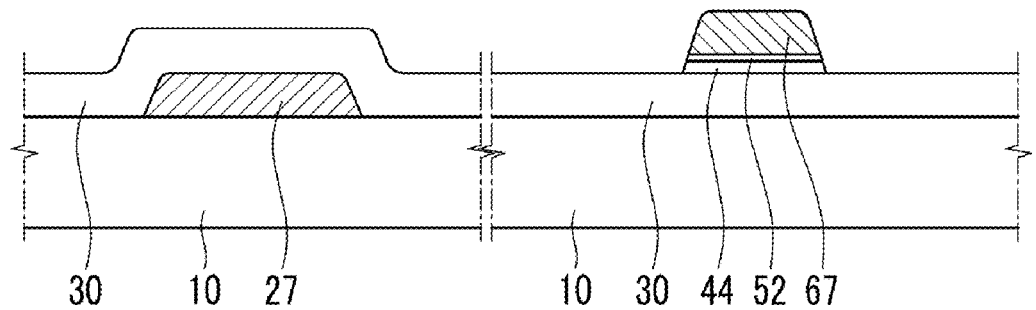

Referring to FIG. 8A, FIG. 8B and FIG. 8C, a region of the exposed data conductive layer 64 corresponding to the channel region is etched using the first region 211 as an etching mask. As a result patterns of the source electrode 65 and the drain electrode 66 are formed and the second amorphous silicon layer 54 is exposed through the space between the source electrode 65 and the drain electrode 66. The exposed second amorphous silicon layer 54 is etched to be separated. As a result ohmic contact layers 52, 55, and 56 are formed. The semiconductor layer 44 is exposed in an area where the second amorphous silicon layer 54 is etched.

Figure 9A:
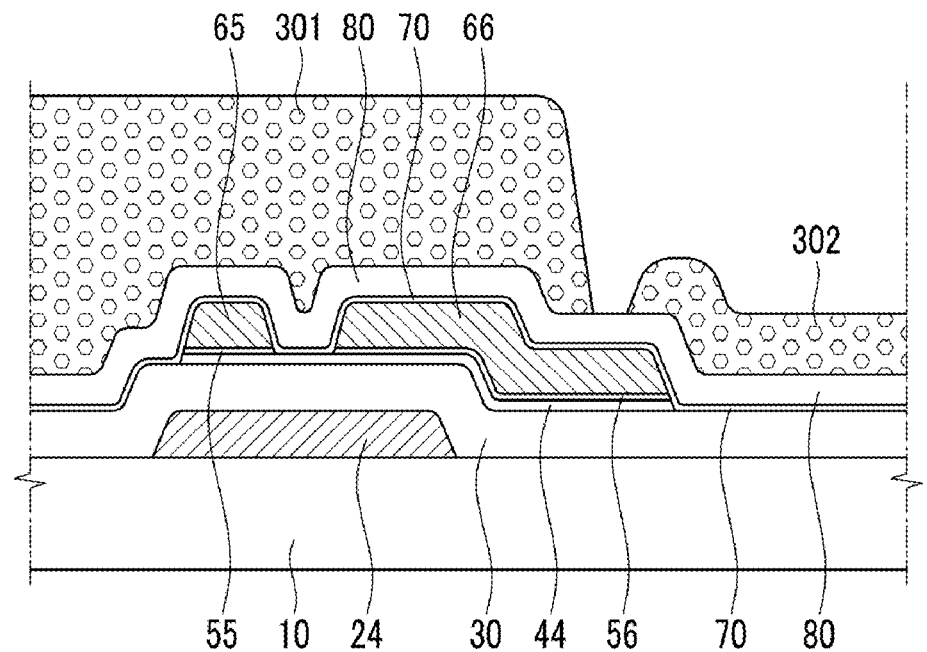
Figure 9B:
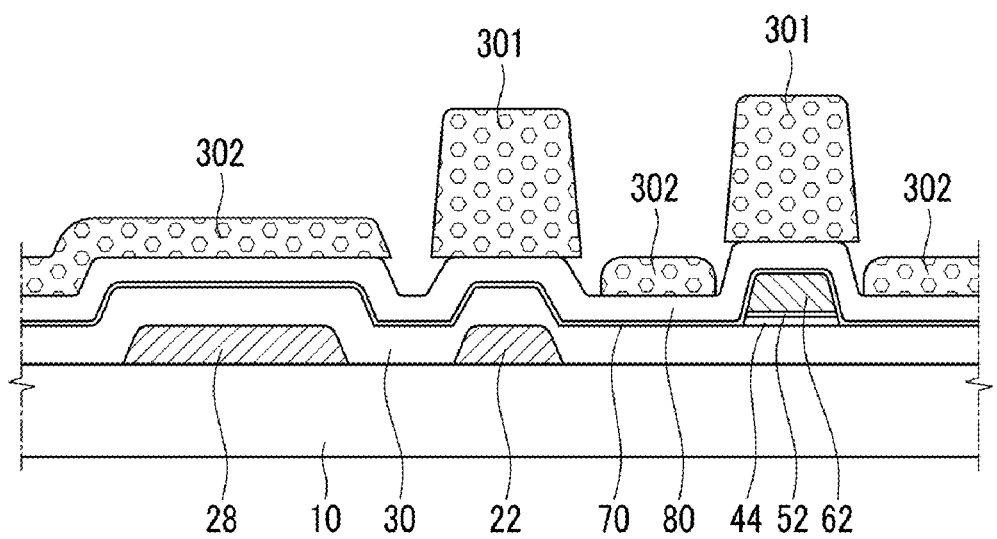
Figure 9C:
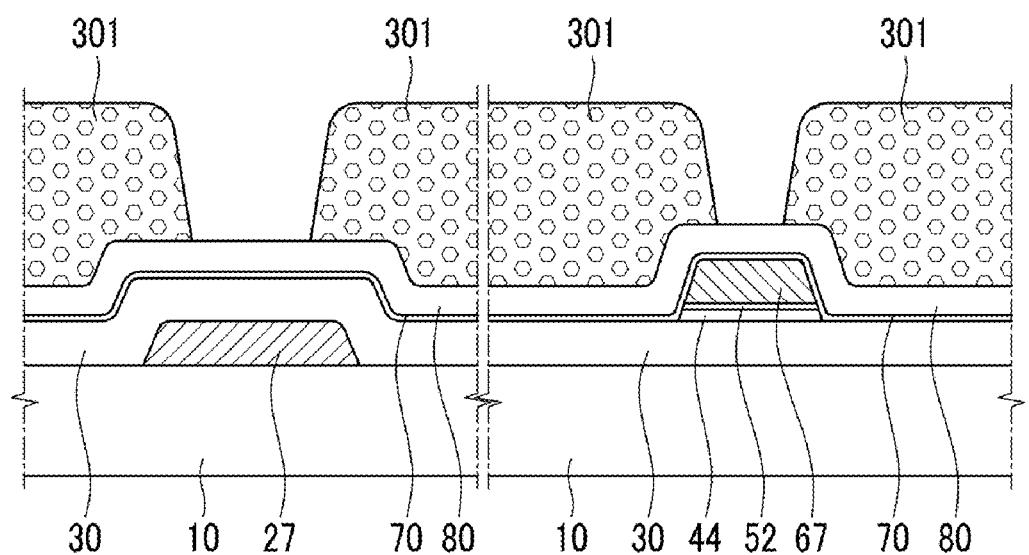

Referring to FIG. 9A, FIG. 9B, and FIG. 9C, a first passivation layer 70 and a second passivation layer 80 are sequentially deposited on the TFT array substrate obtained by performing the processing steps illustrated in FIG. 8A, FIG. 8B, and FIG. 8C.

The first passivation layer 70 and the second passivation layer 80 may be formed of silicon nitride (SiNx) of which reactant gases are silane (SiH4), ammonia (NH3) and nitrogen (N2). In the processing step of making the silicon nitride, activities of the reactant gases are varied depending on the reacting temperature inside the CVD chamber, for example as the reacting temperature increases, the activity of the reactant gas increases resulting in active reactions. This creates a dense lattice structure when the reacting temperature is high. In contrast a porous lattice structure is created when the activity of the reacting gases are slow at a low reacting temperature.

According to an exemplary embodiment of a method to fabricate the TFT substrate, the first passivation layer 70 is formed at a higher temperature than the second passivation layer 80. For example the first passivation layer 70 may be formed at above 300° C. while the second passivation layer 80 may be formed at below 300° C. so that the lattice structure of the first passivation layer 70 may be denser than that of the second passivation layer 80. As a result the first passivation layer 70 is less etched than the second passivation layer 80 such that the outer sidewall of the second passivation layer 80 is positioned inside the outer sidewall of the first passivation layer 70 during the subsequent etching process.

Next a photoresist pattern 301 and 302 is formed on the second passivation layer 80. The photoresist pattern includes a first region 301 and a second region 302 having a smaller thickness than the first region 301. The first region 301 covers a formation area of the gate interconnection line, a formation area of a data interconnection line and a formation area of the semiconductor layer 44. However the second passivation layer 80 remains exposed in a formation area of a drain electrode-pixel electrode contact portion 101, an area of the gate pad 27, and an area of the data pad 67. The second region 302 covers a formation area of the storage electrode 28 and a formation area of the pixel electrode 90.

Figure 10A:
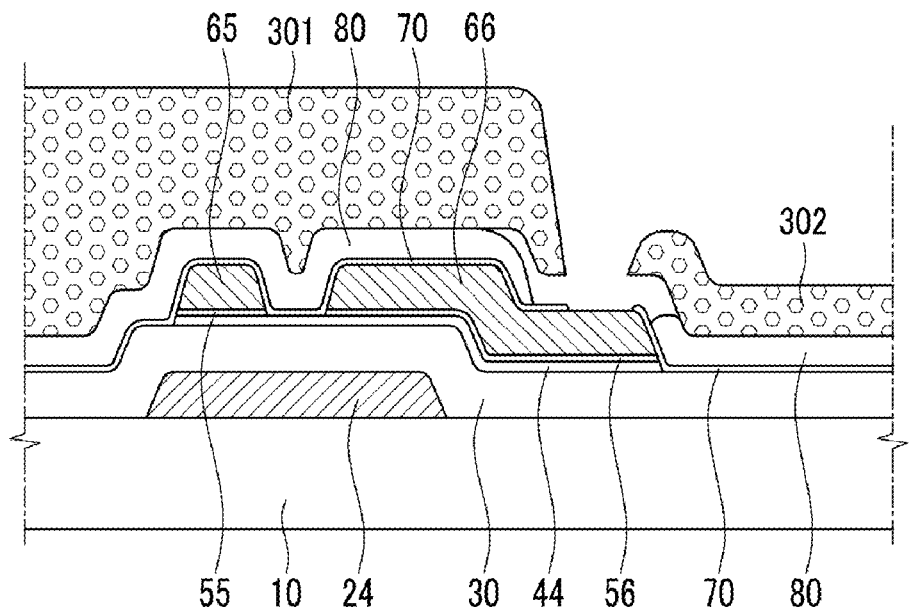
Figure 10B:
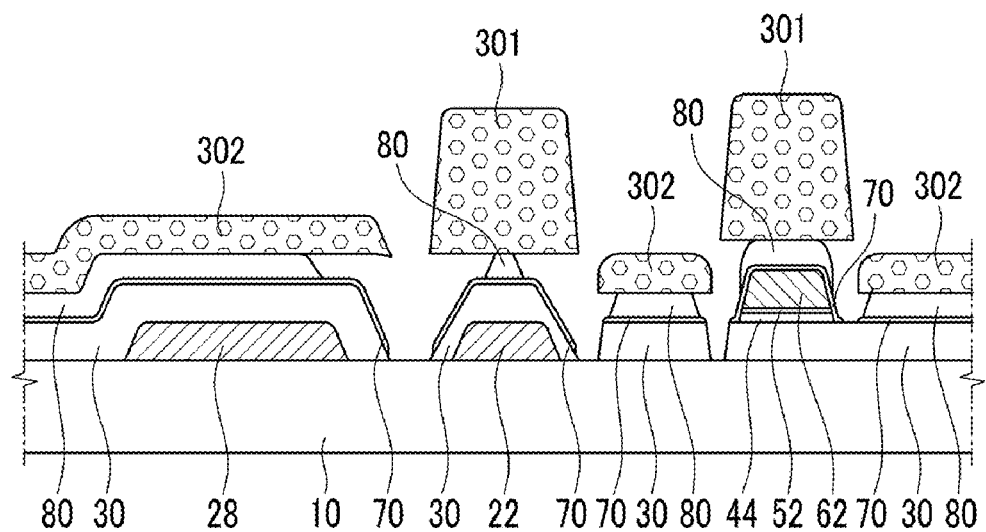
Figure 10C:
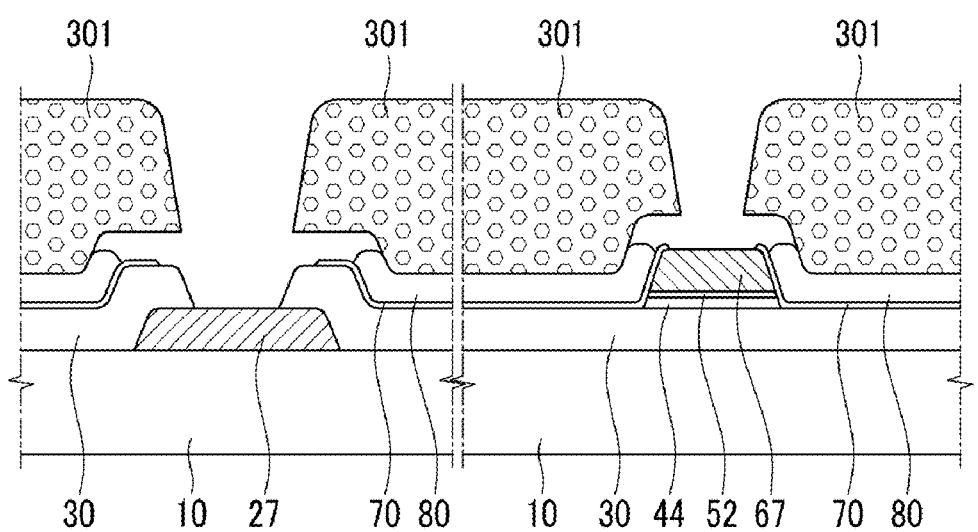

Referring to FIG. 10A, FIG. 10B, and FIG. 10C, the exposed second passivation layer 80 and the first passivation layer 70 are etched using the photoresist pattern 301 as an etching mask. The second passivation layer 80 and the first passivation layer 70 may be etched using, for example, dry etching. Here the etching may be anisotropic etching or isotropic etching. In order to secure a lift-off margin due to an undercut, isotropic etching may be used.

As described above, since the lattice structure of the second passivation layer 80 is more porous than the first passivation layer 70, the etching rate of the second passivation layer 80 is faster than the etching rate of the first passivation layer 70 when using the same etching gas. Thus, the second passivation layer 80 can be over-etched inside of the photoresist pattern 301 sufficiently, thereby securing an undercut having a large width while the first passivation layer 70 is etched through the photoresist pattern 301, 302. In other words, while etching the first passivation layer 70 and the second passivation layer 80 using the photoresist pattern 301, 302 the outer sidewall of the first passivation layer 70 protrudes from the outer sidewall of the second passivation layer 80.

During over-etching of the second passivation layer 80, the first passivation layer 70 covering structures such as the data pad 67 and the drain electrode 66 protects them from etching. Since the data pad 67 and the drain electrode 66 are not over-etched during the etching process, a sufficiently large contact area between conductive materials can be achieved in the drain electrode-pixel electrode contact portion 101 and in the data contact portion 77. In addition the semiconductor layer 44 is protected by the first passivation layer 70 during over-etching of the second passivation layer 80, thereby preventing undercut of the semiconductor layer 44.

As a result of the above etching, the drain electrode 66 is exposed and the gate pad 27 and the data pad 67 are also exposed, thereby forming a drain electrode-pixel electrode contact portion 101, a gate contact portion 76 and the data contact portion 77, respectively.

Figure 11A:
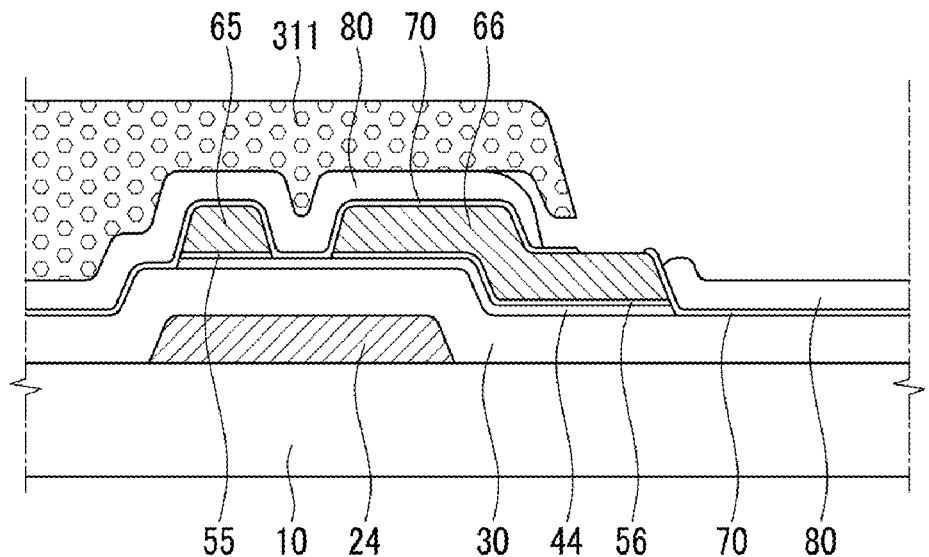
Figure 11B:
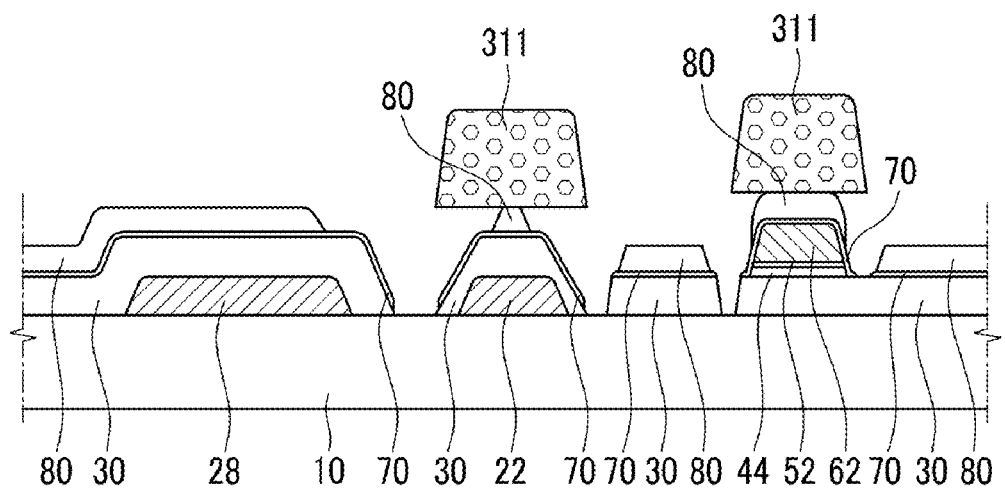
Figure 11C:
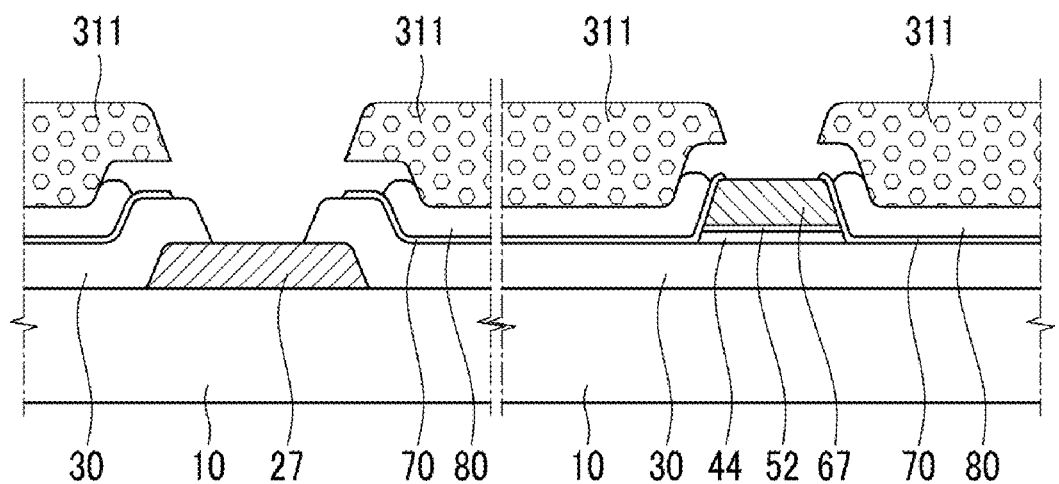

Referring to FIG. 11A, FIG. 11B and FIG. 11C, the second region 302 of the photoresist pattern may be removed using an ashing process. During the ashing process, the first region 301 of the photoresist pattern may be reduced in size. After the second region 302 of the photoresist pattern is removed, the second passivation layer 80 is exposed in a pixel region. This ashing process may be skipped once the second region 302 is already removed during the above etching step of the second passivation layer 80 and the first passivation layer 70.

Figure 12A:
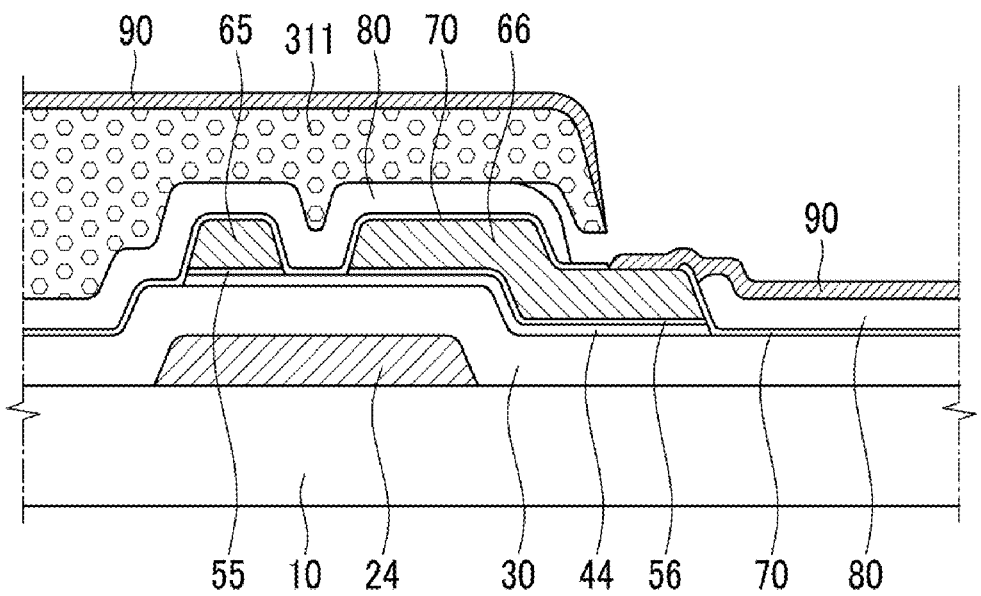
Figure 12B:
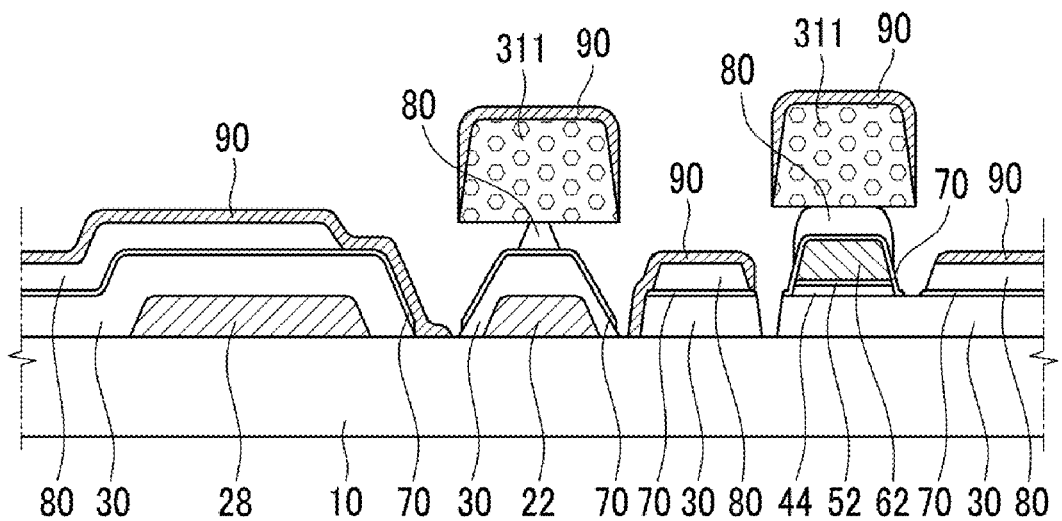
Figure 12C:
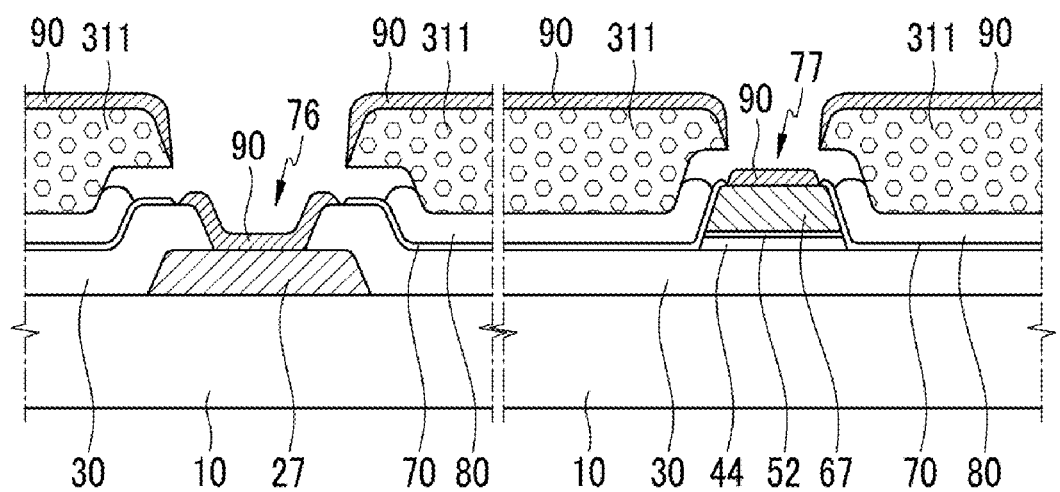

Referring to FIG. 12A, FIG. 12B and FIG. 12C, a pixel electrode conductive material 90 is deposited on the entire surface of the insulating substrate 10 using, for example, sputtering. A portion of the pixel electrode conductive material 90 is deposited on the photoresist pattern 311 and the remaining pixel electrode conductive material 90 is deposited on the exposed structure.

Referring back to FIG. 2A, FIG. 2B, and FIG. 2C, the photoresist pattern 311 and the pixel electrode conductive material 90 thereon may be removed using a lift-off process. More specifically, if a photoresist stripper including an amine group and a glycol group contacts the photoresist pattern 311 by spraying or dipping, it may remove the photoresist pattern 311 from the second passivation film 82 by dissolving the photoresist pattern 311. Here a removal rate of the photoresist pattern 311 and the pixel electrode conductive material 90 thereon is dependant on the contact time and contact area of the photoresist stripper on the photoresist pattern 311. In this step, since the width of the undercut formed by the second passivation layer 80 under the first region 311 of the photoresist pattern is large, a contact area between the first region 311 of the photoresist pattern and the photoresist stripper increases. Therefore, it can be easily understood that the removal rate of the photoresist stripper with respect to the photoresist pattern 311 and the pixel electrode conductive material 90 thereon is improved. As a result of the removal of the photoresist pattern 311 and the pixel electrode conductive material 90, patterns of a pixel electrode 92, an auxiliary gate pad 96, and an auxiliary data pad 97 are formed.

Hereinafter another method of fabricating a TFT substrate according to an exemplary embodiment of the invention will be described.

In the following description, the same structure and method as in the first embodiment of the invention described above will be described in brief and the description will focus on a difference between two exemplary embodiments of the invention.

Figure 13A:
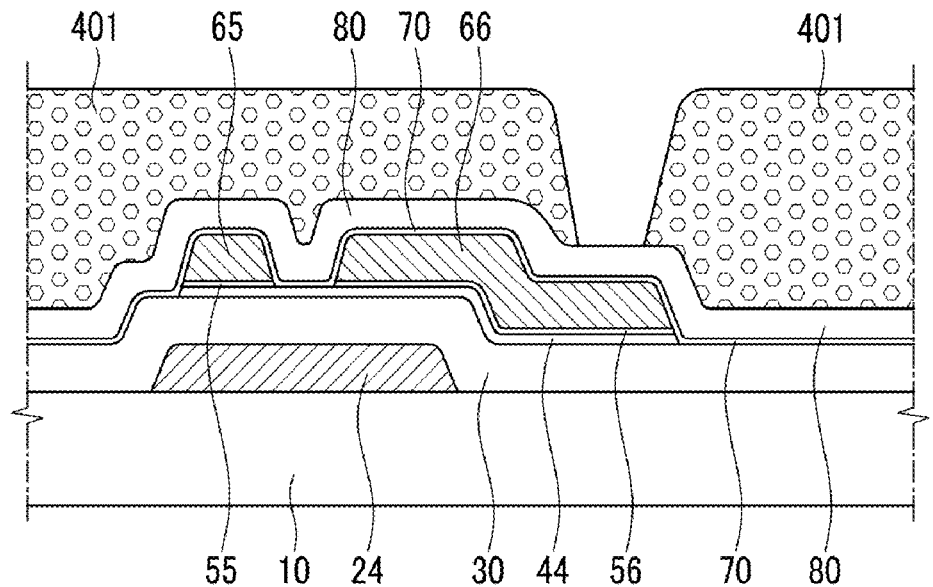
FIGS. 13A to 14C are cross-sectional views showing processing steps of the method of fabricating the TFT substrate according to another exemplary embodiment of the invention
Figure 13B:
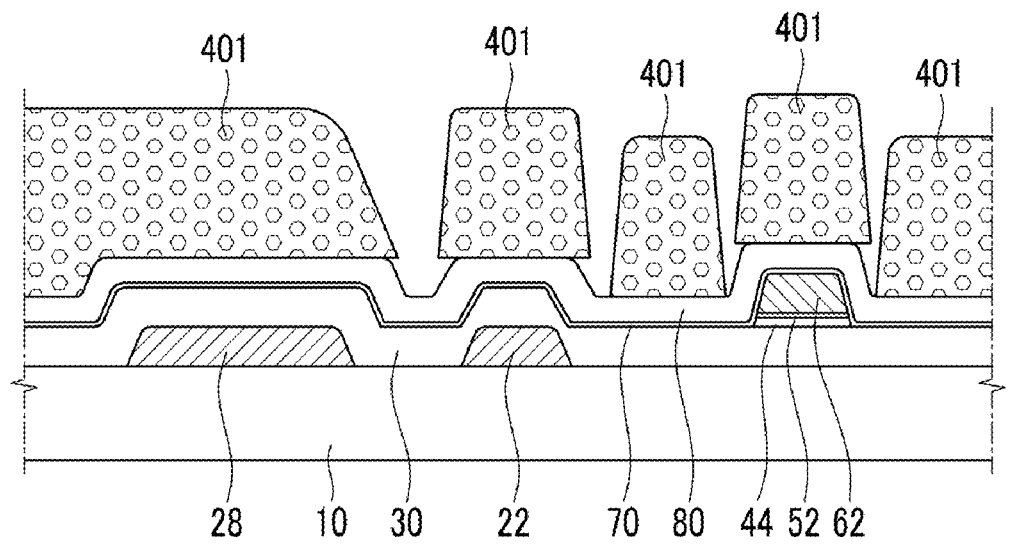
Figure 13C:
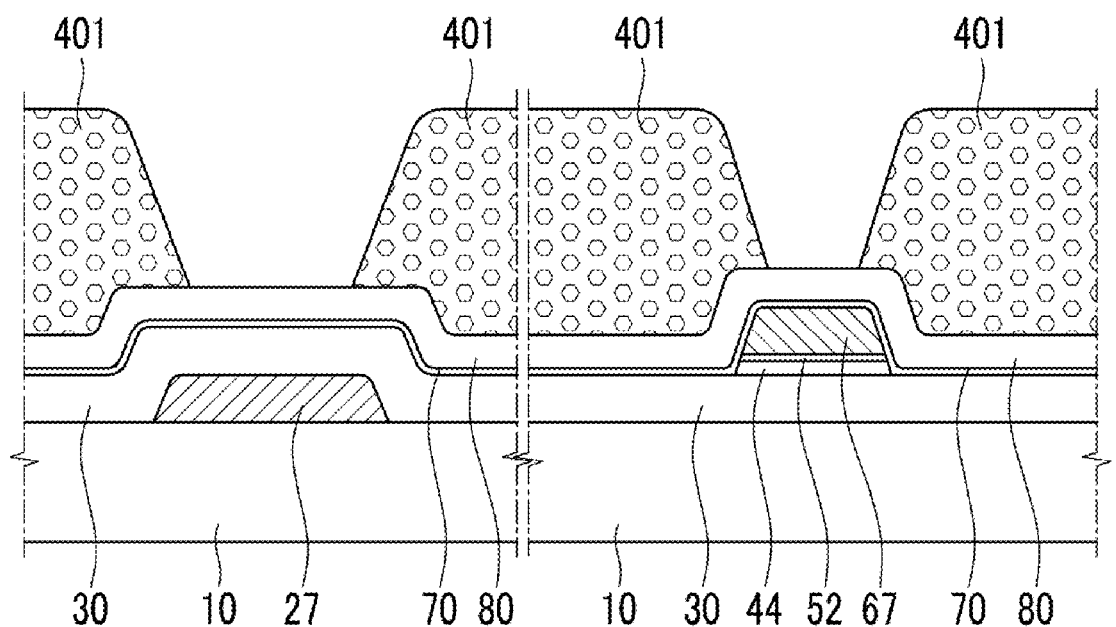
Figure 14A:
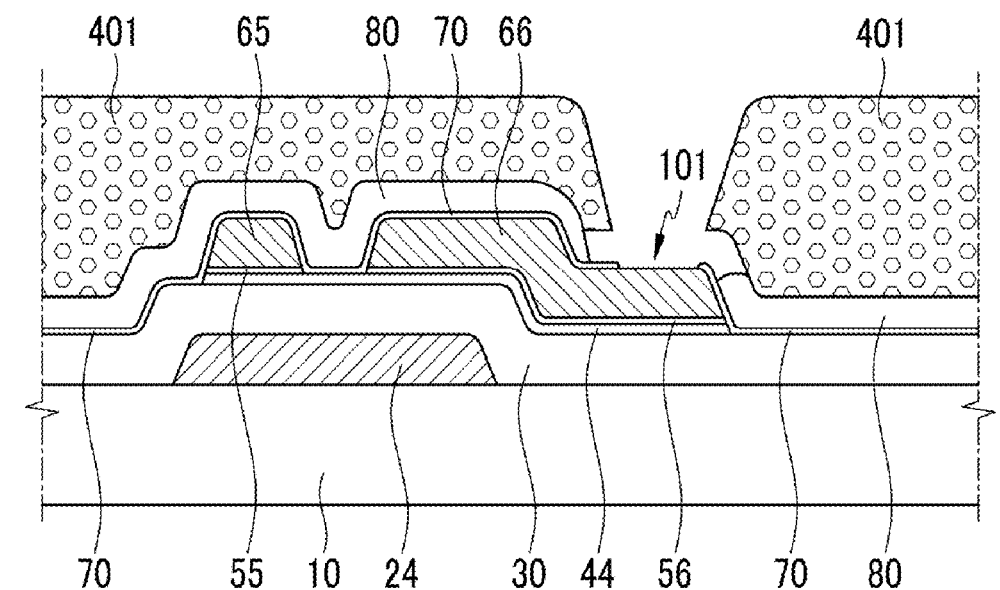

FIGS. 13A and 14A are cross-sectional views showing processing steps of the method of fabricating the TFT substrate shown in FIG. 2A, FIGS. 22B and 23B are cross-sectional views showing processing steps of the method of fabricating the TFT substrate shown in FIG. 17B and FIGS. 22C and 23C are cross-sectional views showing processing steps of the method of fabricating the TFT substrate shown in FIG. 17C.

The method according to this exemplary embodiment of the invention is substantially similar to the method according to the first exemplary embodiment of the invention until forming the source electrode 65 and the drain electrode 66, and the ohmic contact layers 52, 55 and 56, and exposing the semiconductor layer 44.

Figure 14B:
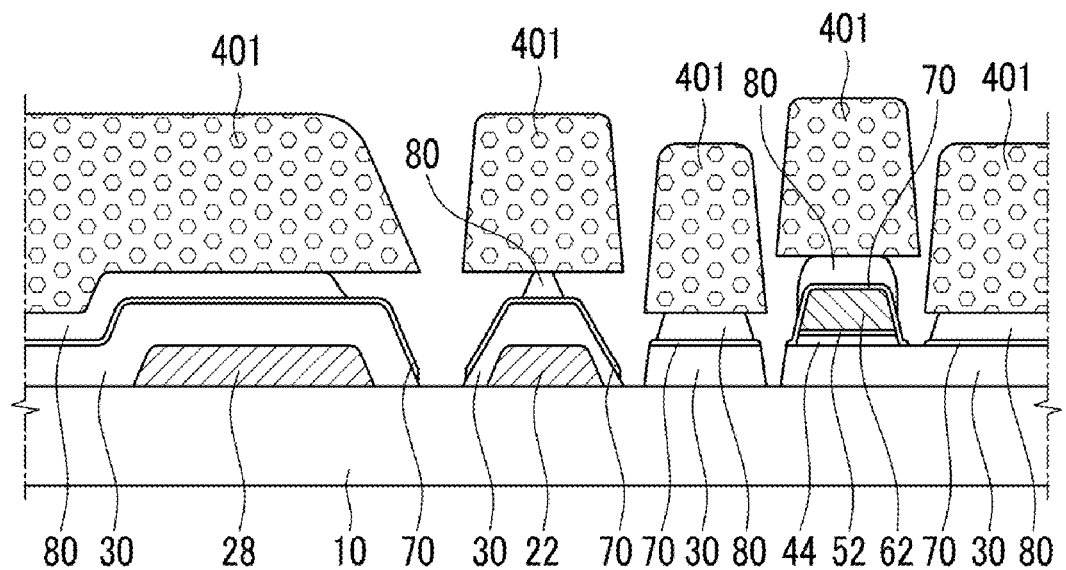
Figure 14C:
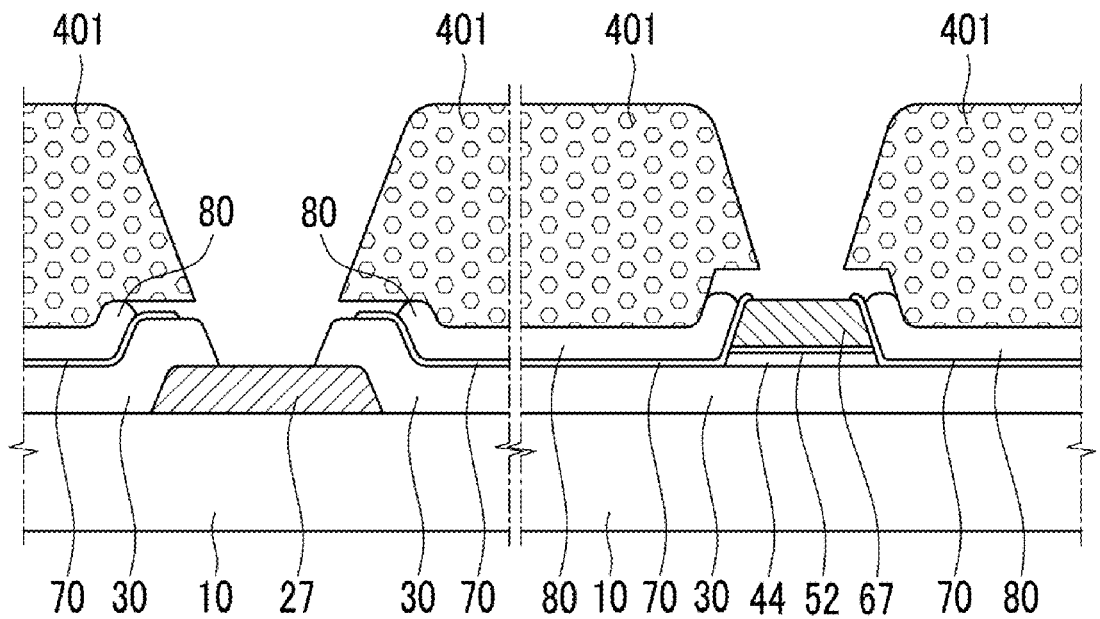

Referring to FIG. 13A, FIG. 14B and FIG. 14C, the photoresist pattern 401 having a uniform thickness is deposited on the second passivation layer 80 and the first passivation layer 70.

Referring to FIG. 14A, FIG. 14B and FIG. 14C, the exposed second passivation layer 80, the first passivation layer 70 and the gate insulating layer 30 are etched using the photoresist pattern 601 as an etching mask. As a result, the drain electrode 66 of the drain electrode-pixel electrode contact portion 101, the gate pad 27 of the gate contact portion 76 and the data pad 67 of the data contact portion 77 are exposed. In this etching step, the drain electrode 66 and the data pad 67 under the first passivation layer 70 are protected from an etching gas until the first passivation layer 70 is etched and removed. Thus the drain electrode 66 and the data pad 67 under the first passivation layer 70 are prevented from damage.

Although not shown in the figures, the photoresist pattern 401 is removed and the pixel electrode conductive material is deposited and is patterned using a photolithography process, thereby the pixel electrode 92, the auxiliary gate pad 96, and the auxiliary data pad 97 are formed as shown in FIG. 2A, FIG. 2B and FIG. 2C.

Although the exemplary embodiments of the invention are described with reference to the figures, it will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A thin film transistor (TFT) substrate, comprising:
a gate interconnection line comprising a gate line and a gate electrode arranged on an insulating substrate;
a gate insulating layer formed on the gate interconnection line;
a semiconductor layer formed on the gate insulating layer;
a data interconnection line comprising a data line, a source electrode, and a drain electrode formed on the semiconductor layer;
a first passivation layer formed on the data interconnection line and exposing a portion of the drain electrode;
a second passivation layer formed on the first passivation layer, wherein the outer sidewalls of the second passivation layer are positioned inside the outer sidewalls of the first passivation layer; and
a pixel electrode connected to the drain electrode,
wherein the first passivation layer is formed of a same material as the second passivation layer and the lattice structure of the first passivation layer is denser than the lattice structure of the second passivation layer.

2. The TFT substrate of claim 1, further comprising:
a gate pad formed at one terminal of the gate line;
a gate pad contact portion formed through the gate insulating layer, the first passivation layer and the second passivation layer and exposing the gate pad: and
an auxiliary gate pad connected to the gate pad via the gate pad contact portion.

3. The TFT substrate of claim 2, further comprising:
a data pad formed at one terminal of the data line:
a data pad contact portion formed through the first passivation layer and the second passivation layer and exposing the data pad; and
an auxiliary data pad connected to the data pad via the data pad contact portion.

4. The TFT substrate of claim 3,
wherein the auxiliary gate pad and the auxiliary data pad are formed of the same material as the pixel electrode.

5. The TFT substrate of claim 3, further comprising:
a storage electrode arranged on the insulating substrate, wherein the storage electrode overlaps with the pixel electrode and the gate insulating layer is interposed therebetween.

* * * * *